US009236557B2

(12) United States Patent
Zhang et al.

(10) Patent No.: US 9,236,557 B2
(45) Date of Patent: Jan. 12, 2016

(54) MAGNETIC TUNNEL JUNCTION BETWEEN METAL LAYERS OF A SEMICONDUCTOR DEVICE

(71) Applicant: GLOBALFOUNDRIES Inc., Grand Cayman (KY)

(72) Inventors: Xunyuan Zhang, Albany, NY (US); Ruilong Xie, Niskayuna, NY (US); Xiuyu Cai, Niskayuna, NY (US); Hyun-Jin Cho, Palo Alto, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/156,210

(22) Filed: Jan. 15, 2014

(65) Prior Publication Data
US 2015/0200353 A1 Jul. 16, 2015

(51) Int. Cl.
*H01L 21/00* (2006.01)
*H01L 43/02* (2006.01)
*H01L 43/12* (2006.01)

(52) U.S. Cl.
CPC .............. *H01L 43/02* (2013.01); *H01L 43/12* (2013.01)

(58) Field of Classification Search
CPC .............. H01L 28/55; H01L 27/11502; H01L 27/11507; H01L 43/02; H01L 21/31691
USPC .......................................................... 438/3
See application file for complete search history.

(56) References Cited

U.S. PATENT DOCUMENTS

| | | | |
|---|---|---|---|
| 6,287,922 B1 | 9/2001 | Yu et al. | |
| 8,623,735 B2 | 1/2014 | Lee et al. | |
| 8,652,917 B2 | 2/2014 | Lenski et al. | |
| 8,809,149 B2 | 8/2014 | Lee et al. | |
| 2013/0117002 A1 | 5/2013 | Goo et al. | |
| 2014/0284734 A1* | 9/2014 | Kanaya et al. | 257/421 |

* cited by examiner

*Primary Examiner* — Quoc Hoang
(74) *Attorney, Agent, or Firm* — Williams Morgan, P.C.

(57) ABSTRACT

Embodiments herein provide a magnetic tunnel junction (MTJ) formed between metal layers of a semiconductor device. Specifically, provided is an approach for forming the semiconductor device using only one or two masks, the approach comprising: forming a first metal layer in a dielectric layer of the semiconductor device, forming a bottom electrode layer over the first metal layer, forming a MTJ over the bottom electrode layer, forming a top electrode layer over the MTJ, patterning the top electrode layer and the MTJ with a first mask, and forming a second metal layer over the top electrode layer. Optionally, the bottom electrode layer may be patterned using a second mask. Furthermore, in another embodiment, an insulator layer (e.g., manganese) is formed atop the dielectric layer, wherein a top surface of the first metal layer remains exposed following formation of the insulator layer such that the bottom electrode layer contacts the top surface of the first metal layer. By forming the MTJ between the metal layers using only one or two masks, the overall number of processing steps is reduced.

10 Claims, 12 Drawing Sheets

MAGNETIC TUNNEL JUNCTION BETWEEN METAL LAYERS OF A SEMICONDUCTOR DEVICE

BACKGROUND

1. Technical Field

This invention relates generally to the field of semiconductor magnetic tunnel junction (MTJ) formation, and more particularly, to forming a MTJ between metal layers of a semiconductor device with a reduced number of processing steps.

2. Related Art

Unlike conventional random access memory (RAM) chip technologies, in magnetic RAM (MRAM), data is not stored as electric charge, but is instead stored by magnetic polarization of a storage element, i.e., a magnetic tunnel junction (MTJ). The elements are formed from two ferromagnetic plates, each of which can hold a magnetic field, separated by a thin insulating layer. One of the two plates is a permanent magnet set to a particular polarity; the magnetization polarity of the other "writable" plate will change to match that of a sufficiently strong external field. A memory device is built from a grid of such cells.

Reading is accomplished by measuring the electrical resistance of the cell. A particular cell is conventionally selected by powering an associated transistor, which switches current from a supply line through the cell to ground. Due to the tunneling magnetoresistance effect, the electrical resistance of the cell changes due to the orientation of the fields in the two plates. By measuring the resulting current, the resistance inside any particular cell can be determined, and from this, the polarity of the writable plate. Conventionally, two plates having the same polarity is considered a state "0", whereas if the two plates are of opposite polarity, the resistance will be higher and is considered a state "1".

One significant determinant of a memory system's cost is the density of the components. Smaller components, and fewer components per cell, mean that more cells may be packed onto a single chip, which in turn means more chips can be produced at once from a single silicon wafer and fabricated at lower cost and improved yield.

In addition, the manufacturing process flow affects cost, with more mask processes contributing to increased overall manufacturing costs. When fabrication of conventional MRAM requires a number of mask processes dedicated solely to the fabrication of the MTJ structure, costs are further increased.

SUMMARY

In general, embodiments herein provide a magnetic tunnel junction (MTJ) formed between metal layers of a semiconductor device. Specifically, provided is an approach for forming the semiconductor device using no more than two masks, the approach comprising: forming a first metal layer in a dielectric layer of the semiconductor device, forming a bottom electrode layer over the first metal layer, forming a MTJ over the bottom electrode layer, forming a top electrode layer over the MTJ, patterning the top electrode layer and the MTJ with a first mask, and forming a second metal layer over the top electrode layer. Optionally, the bottom electrode layer may be patterned using a second mask. Furthermore, in another embodiment, an insulator layer (e.g., manganese) is formed atop the dielectric layer, wherein a top surface of the first metal layer remains exposed following formation of the insulator layer such that the bottom electrode layer contacts the top surface of the first metal layer. By forming the MTJ between the metal layers using only one or two masks, the overall number of processing steps is reduced.

One aspect of the present invention includes a method for forming a magnetic tunnel junction (MTJ) between metal layers of a semiconductor device, the method comprising: forming the semiconductor device using a set of processing steps including no more than two masks, the set of processing steps comprising: forming a first metal layer in a dielectric layer of the semiconductor device; forming a bottom electrode layer over the first metal layer; forming a MTJ over the bottom electrode layer; forming a top electrode layer over the MTJ; patterning the top electrode layer and the MTJ with a first mask; and forming a second metal layer over the top electrode layer.

Another aspect of the present invention includes a method for forming a magnetic tunnel junction (MTJ) between metal layers of a semiconductor device, the method comprising: forming the semiconductor device using a set of processing steps including no more than two masks, the set of processing steps comprising: forming a first metal layer in a dielectric layer of the semiconductor device; forming a bottom electrode layer over the first metal layer; forming a MTJ over the bottom electrode layer; forming a top electrode layer over the MTJ; patterning the top electrode layer and the MTJ with a first mask; forming an in-situ passivation layer over the semiconductor device; and forming a second metal layer over the top electrode layer.

Yet another aspect of the present invention includes a magnetic tunnel junction (MTJ) device, comprising: a first metal layer formed in a dielectric layer of the MTJ device; a bottom electrode layer formed over the first metal layer; a MTJ formed over the bottom electrode layer; a top electrode layer formed over the MTJ, wherein the top electrode layer and the MTJ are patterned using a first mask; and a second metal layer formed over the top electrode layer.

BRIEF DESCRIPTION OF THE DRAWINGS

These and other features of this invention will be more readily understood from the following detailed description of the various aspects of the invention taken in conjunction with the accompanying drawings in which.

Figure 1A:
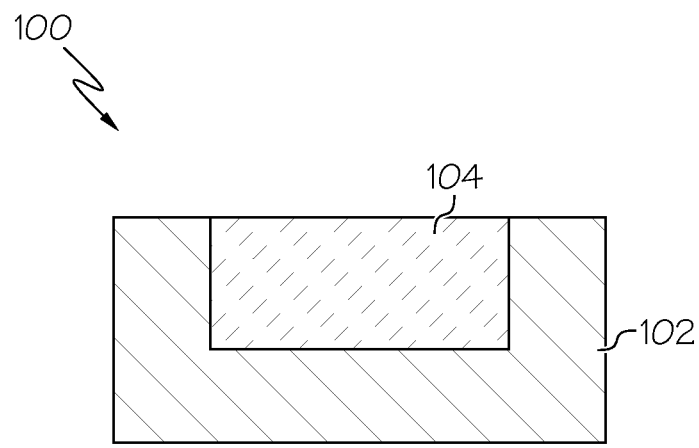
FIG. 1(a) shows a cross-sectional view of a semiconductor device following a bottom back-end-of-the-line (BEOL) layer planarization according to an illustrative embodiment.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Also, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As stated above, described herein are approaches for providing a magnetic tunnel junction (MTJ) formed between metal layers of a semiconductor device using only one or two masks/masking steps. Specifically, provided are methods for forming a first metal layer in a dielectric layer of the semiconductor device, forming a bottom electrode layer over the first metal layer, forming a MTJ over the bottom electrode layer, forming a top electrode layer over the MTJ, patterning the top electrode layer and the MTJ with a first mask, and forming a second metal layer over the top electrode layer. Optionally, the bottom electrode layer may be patterned using a second mask. Furthermore, in another embodiment, an insulator layer (e.g., manganese) is formed atop the dielectric layer, wherein a top surface of the first metal layer remains exposed following formation of the insulator layer such that the bottom electrode layer contacts the top surface of the first metal layer. By forming the MTJ between the metal layers using only one or two masks, the overall number of processing steps is reduced.

Figure 1B:
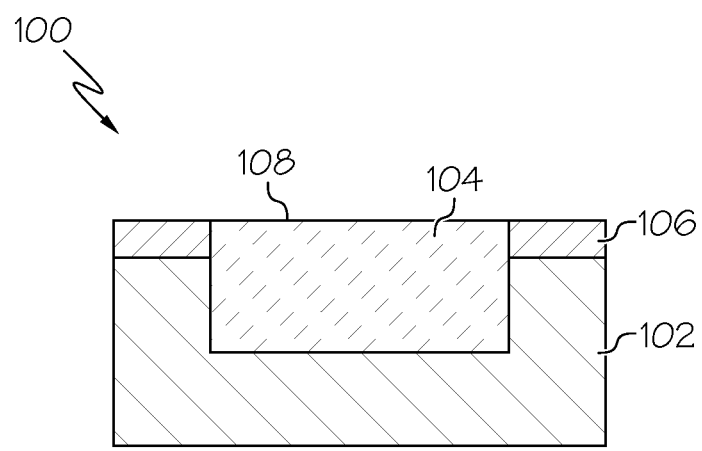
FIG. 1(b) shows a cross-sectional view of the semiconductor device following formation of an insulator layer according to an illustrative embodiment.
Figure 1C:
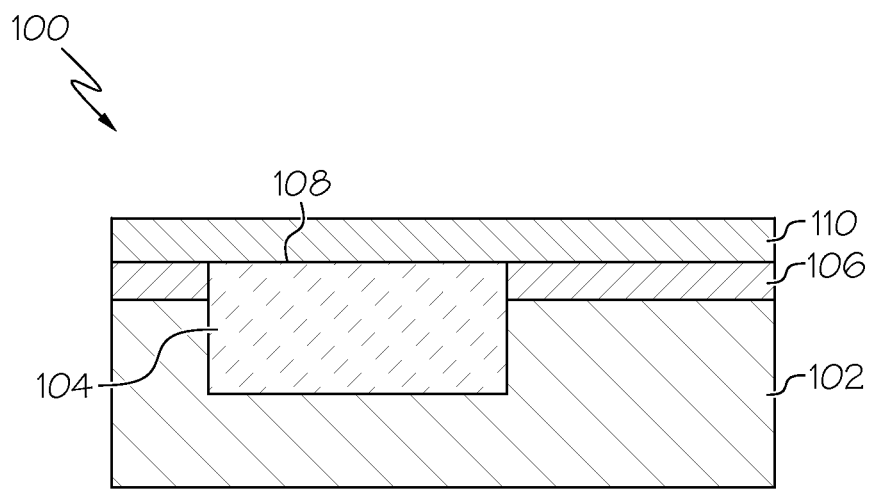
FIG. 1(c) shows a cross-sectional view of the semiconductor device following formation of a bottom electrode layer according to an illustrative embodiment.

With reference now to the figures, FIG. 1(a) shows a cross-sectional view of a semiconductor device 100 (e.g., a MTJ device) according to a first illustrative embodiment. Device 100, depicted after a BEOL layer planarization, comprises a dielectric layer 102 (e.g., a low-k film) and a first metal layer (e.g., copper (Cu)) 104 formed within dielectric layer 102. Formed atop dielectric layer 102 is an insulator layer 106 (e.g., manganese or aluminum), as shown in FIG. 1(b). In one embodiment, a 1-2 nm layer of manganese is deposited (e.g., via chemical vapor deposition (CVD)) using manganese-amidnate as a precursor and ammonia ($NH_3$) as the reaction gas at a temperature greater than 200 C. The manganese forms a manganese silicate over the low-k dielectric layer 102, while leaving a top surface 108 of Cu first metal layer 104 exposed. This occurs because the manganese diffuses away from the Cu. As a result, as shown in FIG. 1(c), a bottom electrode layer 110 is formed directly atop first metal layer 104, such that top surface 108 is in contact with a bottom surface of bottom electrode 110. In one embodiment, bottom electrode layer comprises tantalum, which is planarized, e.g., using chemical mechanical planarization (CMP). As understood to those skilled in the art, a CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished. The material layer to be polished is then polished away with the polish pad and slurry to achieve a desired removal.

Figure 1D:
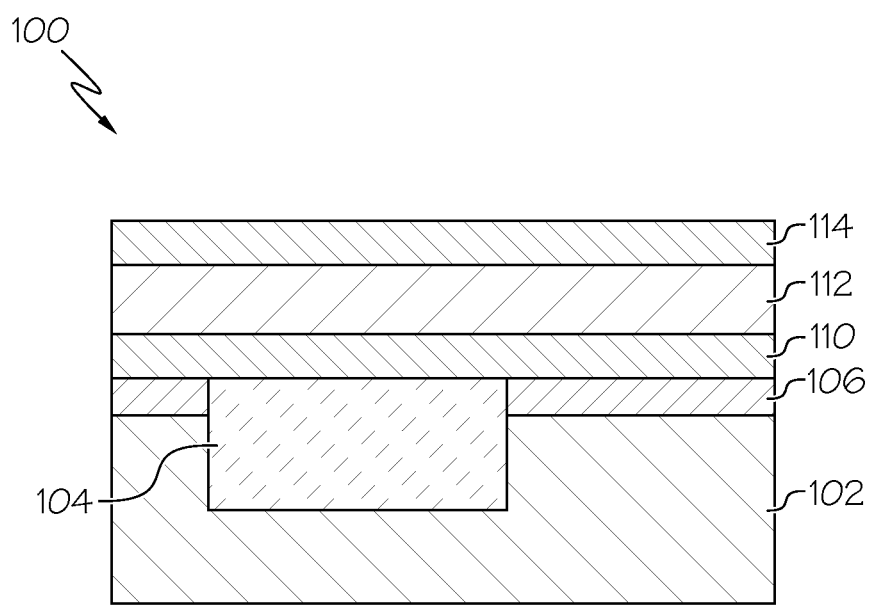
FIG. 1(d) shows a cross-sectional view of the semiconductor device following formation of a MTJ and a top electrode layer according to an illustrative embodiment.

Next, as shown in FIG. 1(d), a MTJ 112 is formed over bottom electrode layer 110, followed by a top electrode layer 114 over MTJ 112. Although not specifically shown, MTJ 112 may comprise a pinned layer, a magnetic tunnel barrier, and a free layer, wherein a bit value is represented by a magnetic moment in the free layer. A bit value stored by MTJ 112 is determined by a direction of the magnetic moment of the free layer relative to a direction of a fixed magnetic moment carried by the pinned layer. The magnetization of the pinned layer is fixed, while the magnetization of the free layer may be switched.

In one embodiment, top electrode layer 114 comprises tantalum deposited over MTJ 112. However, top electrode layer 114 may alternatively comprise a nitrified metal, such as tantalum nitride (TaN), titanium nitride (TiN), or another nitrified metal that exhibits the properties of being conductive and resistant to oxide formation.

Figure 1E:
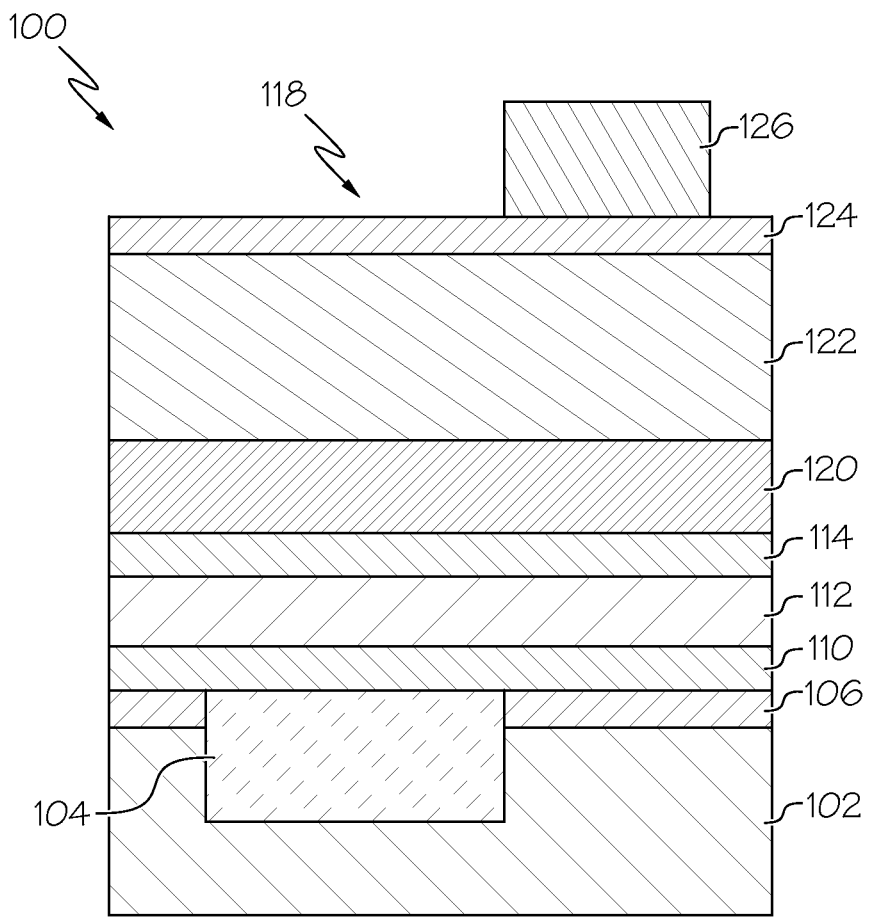
FIG. 1(e) shows a cross-sectional view of the semiconductor device following formation of a first mask according to an illustrative embodiment.
Figure 1F:
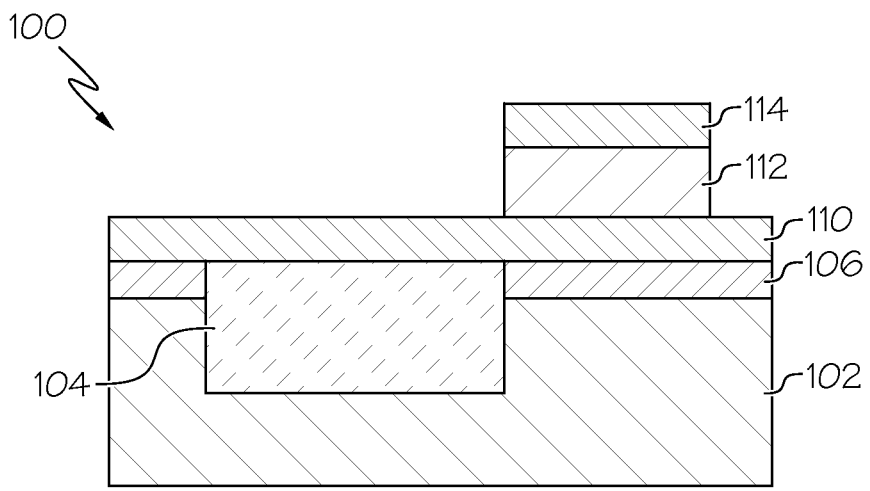
FIG. 1(f) shows a cross-sectional view of the semiconductor device following an etch of the top electrode layer and the MTJ according to an illustrative embodiment.
Figure 1G:
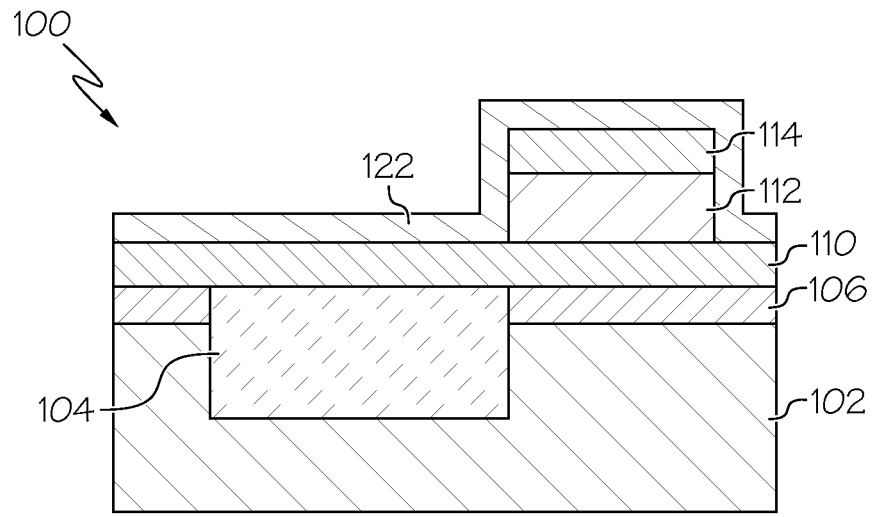
FIG. 1(g) shows a cross-sectional view of the semiconductor device following formation of an in-situ passivation layer according to an illustrative embodiment.
Figure 1H:
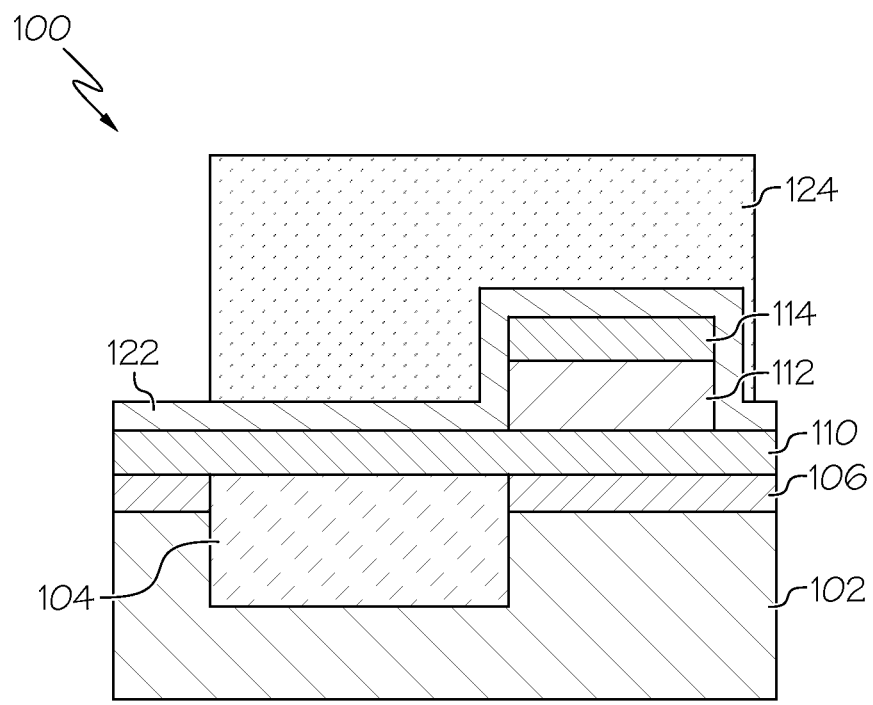
FIG. 1(h) shows a cross-sectional view of the semiconductor device following formation of a second mask according to an illustrative embodiment.
Figure 1I:
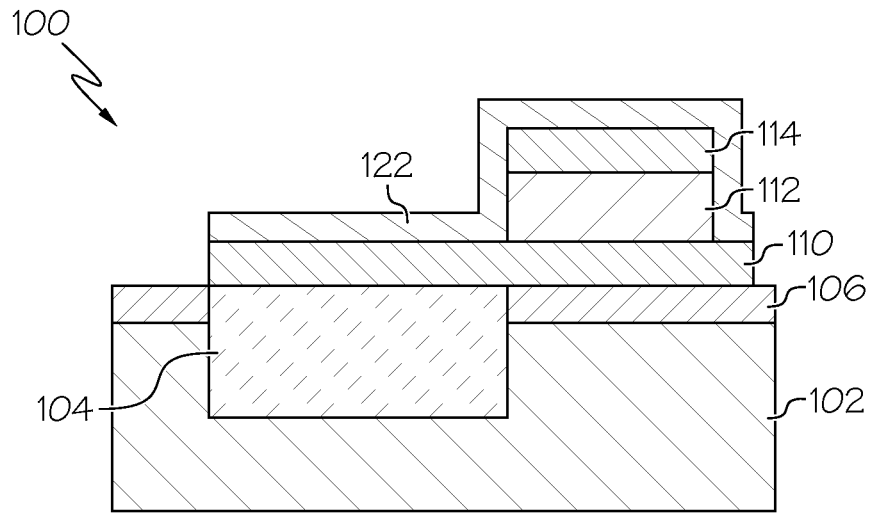
FIG. 1(i) shows a cross-sectional view of the semiconductor device following an etch of the in-situ passivation layer and the bottom electrode layer according to an illustrative embodiment.

Next, as shown in FIG. 1(e), a first mask 118 is formed over semiconductor device 100. In this embodiment, first mask 118 comprises a hard mask layer 120 (e.g., a low temperature oxide), an optical planarizing layer (OPL) 122, a silicon-containing anti-reflective coating (SiARC) layer 124, and a photoresist 126. Top electrode layer 114 and MTJ 112 are patterned using first mask 118, and then etched selective to bottom electrode layer 110, as shown in FIG. 1(f). An in-situ passivation layer 122 is then formed over semiconductor device 100, as shown in FIG. 1(g), wherein in-situ passivation layer 122 comprises a silicon-nitride based material passivated using, e.g., the atmosphere, ion implantation, or by a doped insulator outdiffusion method. Next, a second mask 124 is formed atop semiconductor device 100 to pattern and remove in-situ passivation layer 122 and bottom electrode layer 110 selective to insulator layer 106, as shown in FIGS. 1(h)-1(i). As illustrated, bottom electrode layer 110 extends only partially along insulator layer 106 following patterning of bottom electrode layer 110 using second mask 124.

Figure 1J:
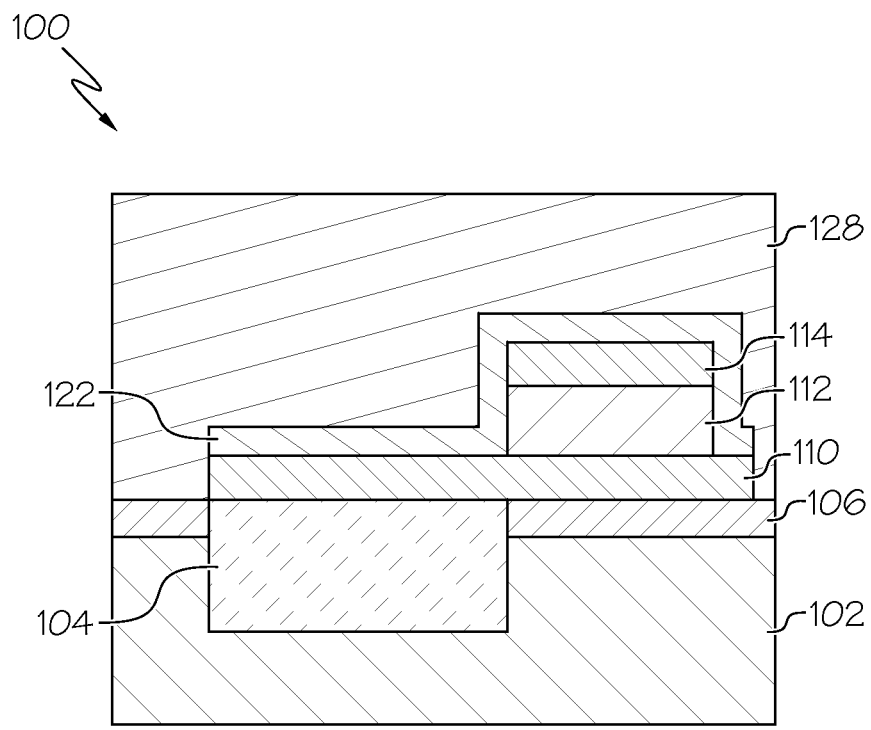
FIG. 1(j) shows a cross-sectional view of the semiconductor device following formation of an interlayer dielectric according to an illustrative embodiment.
Figure 1K:
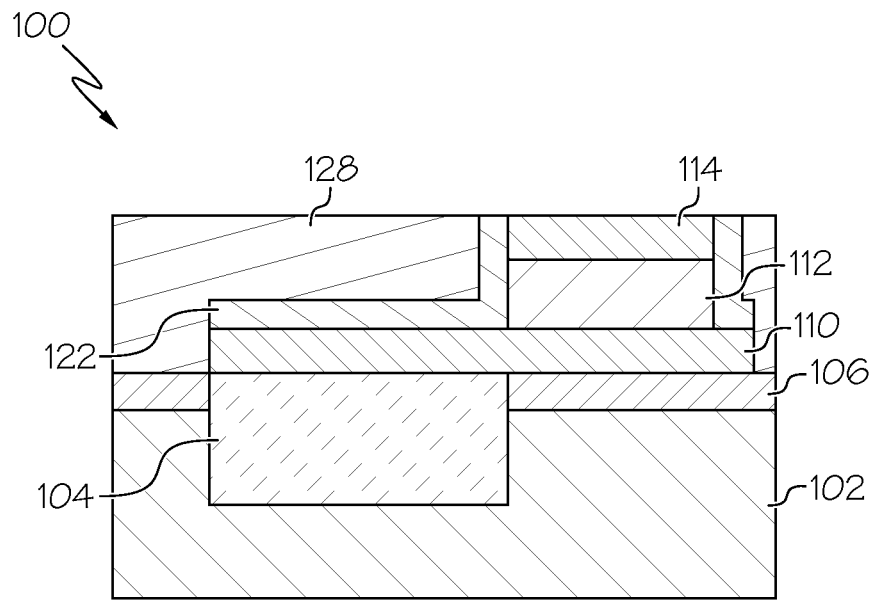
FIG. 1(k) shows a cross-sectional view of the semiconductor device following planarization of the interlayer dielectric according to an illustrative embodiment.
Figure 1L:
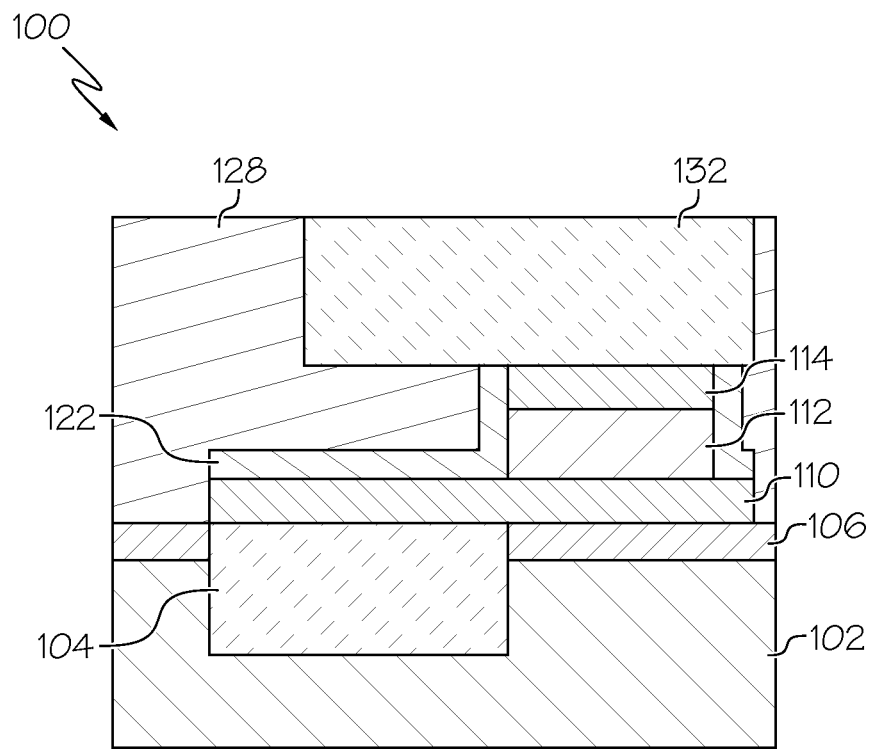
FIG. 1O shows a cross-sectional view of the semiconductor device following formation of a second metal layer according to an illustrative embodiment.

An interlayer dielectric (ILD) 128 is then formed over semiconductor device 100, and the ILD 128 and in-situ passivation layer 122 are planarized (e.g., via CMP) selective to top electrode layer 114 to form a self-aligned top contact opening, as shown in FIGS. 1(j)-1(k). Finally, a second metal layer 132 (i.e., an upper Cu BEOL interconnect) is formed atop top electrode layer 114, as shown in FIG. 1(l). As a result, provided is MTJ 112 formed between metal layers 104 and 132 using only two masks, which decreases overall manufacturing costs.

Figure 2A:
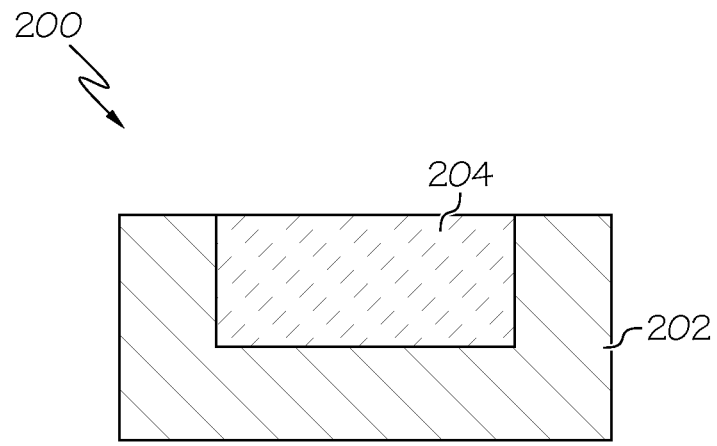
FIG. 2(a) shows a cross-sectional view of a semiconductor device following formation of a first metal layer according to an illustrative embodiment.
Figure 2B:
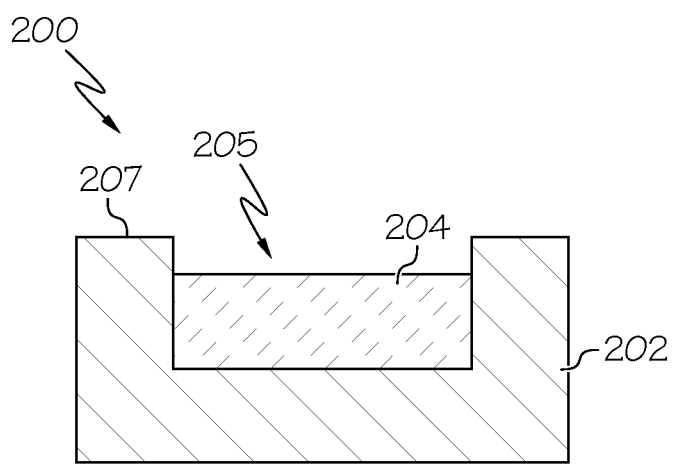
FIG. 2(b) shows a cross-sectional view of the semiconductor device following formation of a recess within the first metal layer according to an illustrative embodiment.
Figure 2C:
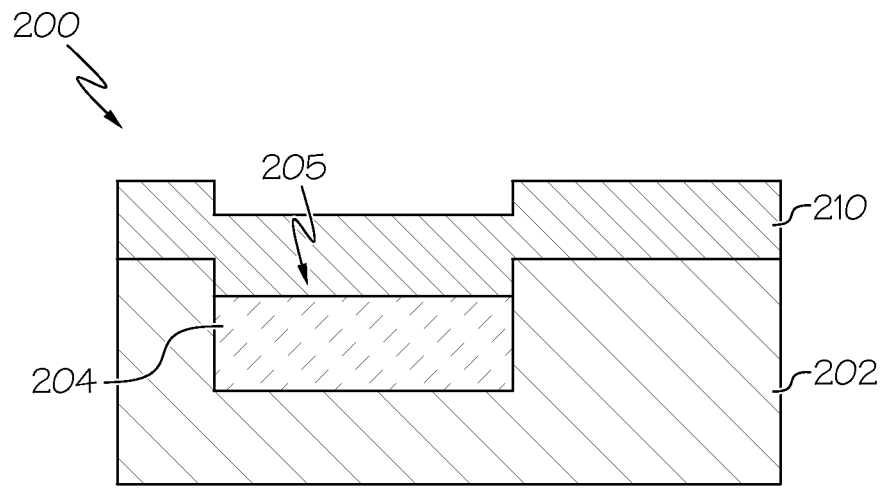
FIG. 2(c) shows a cross-sectional view of the semiconductor device following formation of a bottom electrode over the first metal layer according to an illustrative embodiment.
Figure 2D:
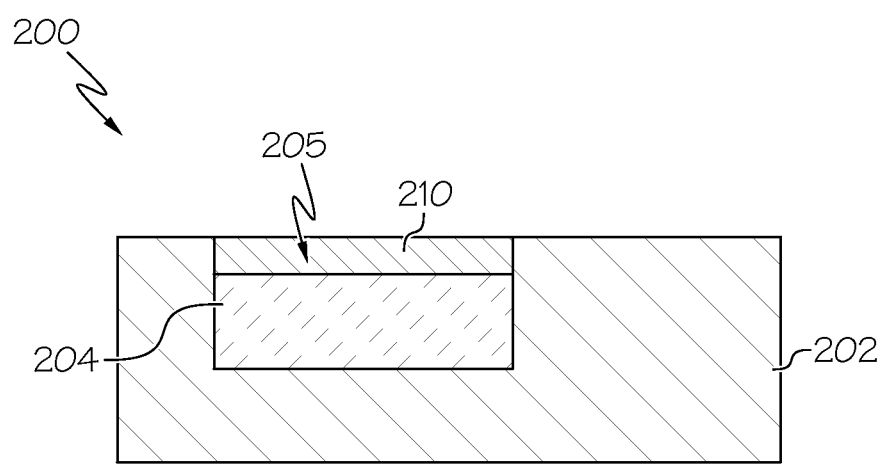
FIG. 2(d) shows a cross-sectional view of the semiconductor device following a planarization of the bottom electrode according to an illustrative embodiment.

Turning now to FIGS. 2(a)-2(k), another approach for forming a MTJ between metal layers of a semiconductor device will be shown and described. As first shown in FIG. 2(a), device 200 comprises a dielectric layer 202 (e.g., a low-k film) and a first metal layer (e.g., copper (Cu)) 204 following a BEOL layer planarization. In this embodiment, first metal layer 204 is then etched (e.g., via a wet etch) to form a recess 205 approximately 10-15 nm below a top surface 207 of dielectric layer 202, as shown in FIG. 2(b). As a result, when a bottom electrode layer 210 is formed over semiconductor device 200 and subsequently planarized, bottom electrode layer 210 remains only within recess 205, as shown in FIGS. 2(c)-2(d).

Figure 2E:
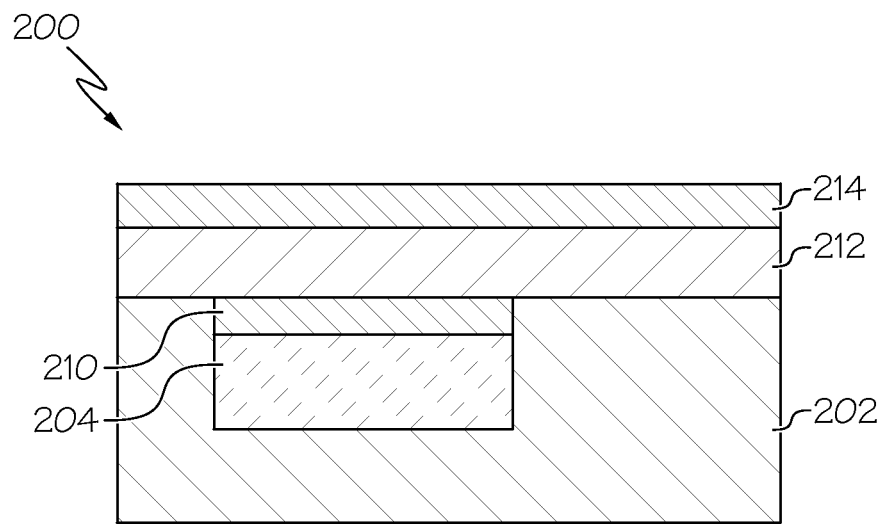
FIG. 2(e) shows a cross-sectional view of the semiconductor device following formation of a MTJ and a top electrode according to an illustrative embodiment.

Next, as shown in FIG. 2(e), a MTJ 212 is formed over bottom electrode layer 210, followed by a top electrode layer 214 over MTJ 212. In one embodiment, top electrode layer 214 comprises tantalum deposited over MTJ 212. However, top electrode layer 214 may alternatively comprise a nitrified metal, such as tantalum nitride (TaN), titanium nitride (TiN), or another nitrified metal that exhibits the properties of being conductive and resistant to oxide formation.

Figure 2F:
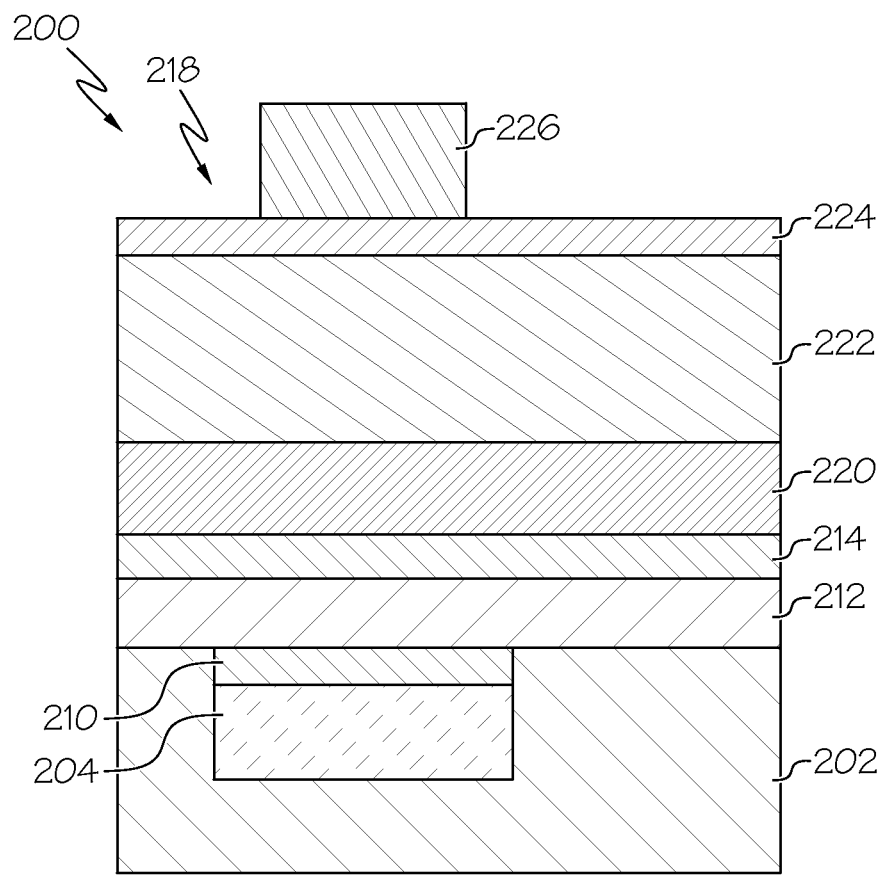
FIG. 2(f) shows a cross-sectional view of the semiconductor device following formation of a first mask according to an illustrative embodiment.
Figure 2G:
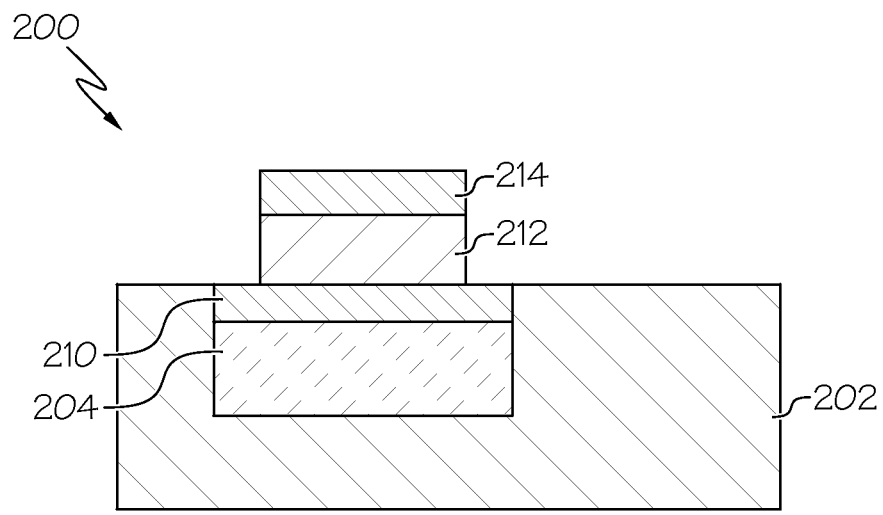
FIG. 2(g) shows a cross-sectional view of the semiconductor device following an etch to the top electrode layer and the MTJ according to an illustrative embodiment.

Next, as shown in FIG. 2(f), a mask 218 is formed over semiconductor device 200. In this embodiment, mask 218 comprises a hard mask layer 220 (e.g., a low temperature oxide), an optical planarizing layer (OPL) 222, a silicon-containing anti-reflective coating (SiARC) layer 224, and a photoresist 226. Top electrode layer 214 and MTJ 212 are patterned using mask 218, and then etched selective to bottom electrode layer 210, as shown in FIG. 2(g). It will be appreciated, that in this embodiment, only a single mask is required to pattern and etch top electrode layer 214 and MTJ 212, as bottom electrode layer 210 is already formed within recess 205 (FIG. 2(b)).

Figure 2H:
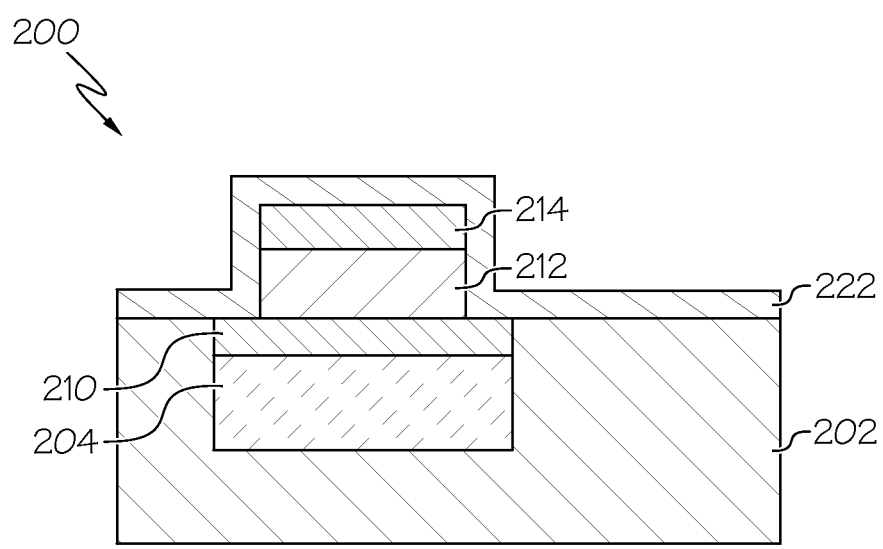
FIG. 2(h) shows a cross-sectional view of the semiconductor device following formation of an in-situ passivation layer according to an illustrative embodiment.
Figure 2I:
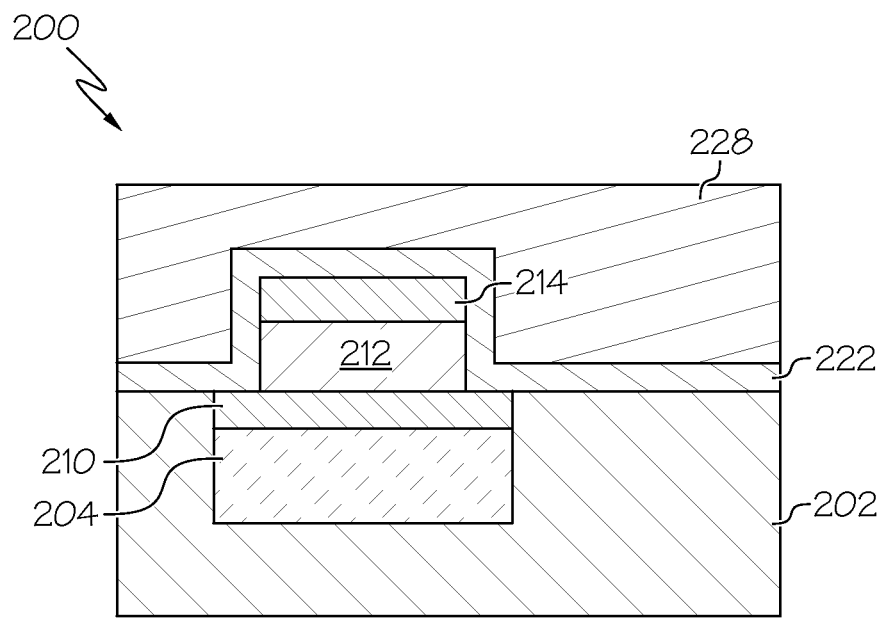
FIG. 2(i) shows a cross-sectional view of the semiconductor device following formation of an interlayer dielectric according to an illustrative embodiment.
Figure 2J:
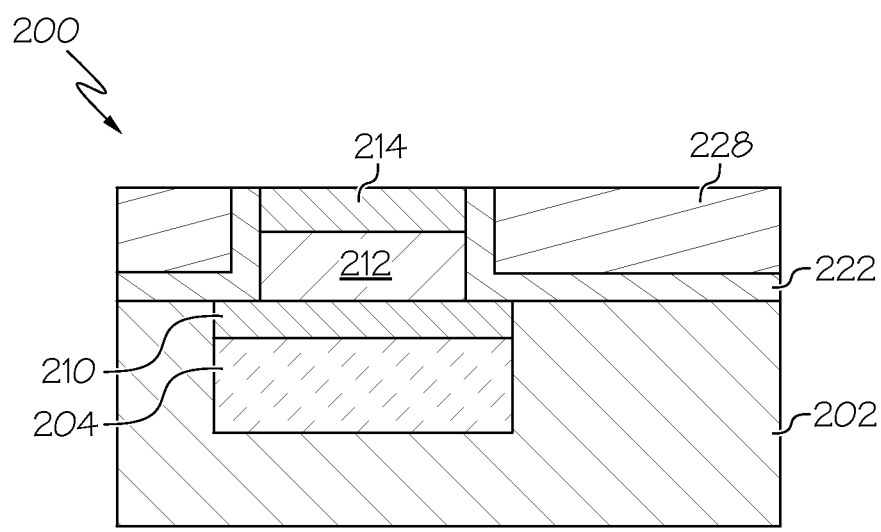
FIG. 2(j) shows a cross-sectional view of the semiconductor device following planarization of the interlayer dielectric according to an illustrative embodiment.
Figure 2K:
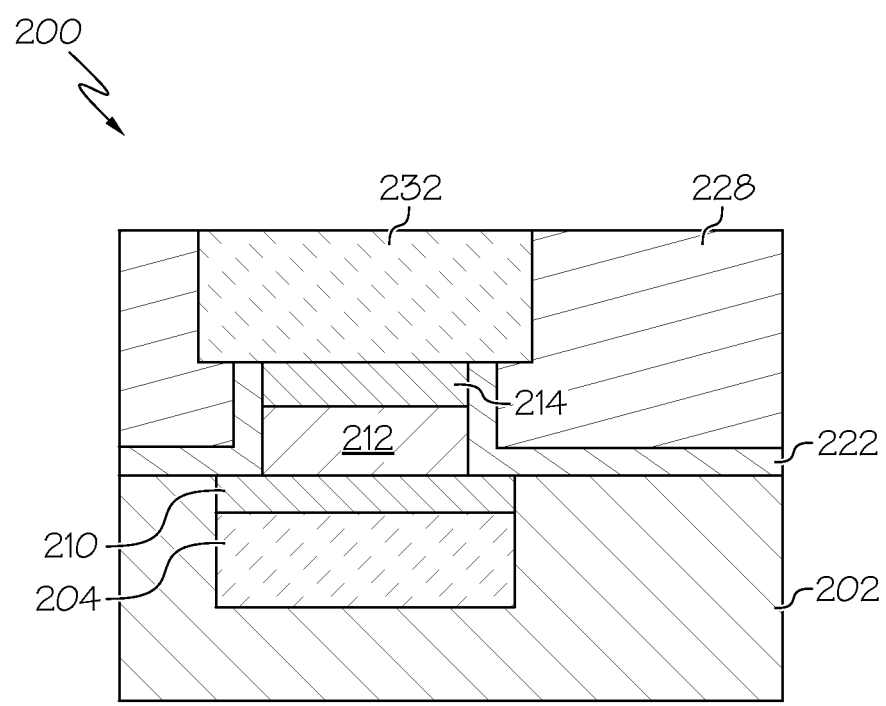
FIG. 2(k) shows a cross-sectional view of the semiconductor device following formation of a second metal layer according to an illustrative embodiment.

An in-situ passivation layer 222 (e.g., a SiN based material) is then formed over semiconductor device 200, as shown in FIG. 2(h), followed by an interlayer dielectric (ILD) 228 over semiconductor device 200, as shown in FIG. 2(i). ILD 228 and in-situ passivation layer 222 are then planarized (e.g., via CMP) selective to top electrode layer 214 to form a self-aligned top contact opening, as shown in FIG. 2(j). Finally, a second metal layer 232 (i.e., an upper BEOL Cu interconnect) is formed atop top electrode layer 214, as shown in FIG. 2(k). As a result, provided is MTJ 212 formed between metal layers 204 and 232 using only a single mask (i.e., first mask 218), which simplifies the process and decreases overall manufacturing costs.

In various embodiments, design tools can be provided and configured to create the datasets used to pattern the semiconductor layers as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Design tools used for implementing the approaches described herein may include a computer system (not shown) having a processing unit that executes computer program code, such as program code for a layout tool, which is stored in memory. While executing computer program code, the processing unit can read and/or write data to/from a memory unit and/or storage system. The storage system may comprise VCRs, DVRs, RAID arrays, USB hard drives, optical disk recorders, flash storage devices, and/or any other data processing and storage elements for storing and/or processing data. The computer system could also include I/O interfaces that communicate with one or more hardware components of a computer infrastructure that enable a user to interact with the computer system (e.g., a keyboard, a display, camera, etc.). The design tools of the computer infrastructure are configured to operate with a fabricator for designing and patterning features of an IC.

It is apparent that there has been provided approaches for forming a MTJ between metal layers of a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a magnetic tunnel junction (MTJ) between metal layers of a semiconductor device, the method comprising:
    forming the semiconductor device using a set of processing steps including no more than two masks, the set of processing steps comprising:
        forming a first metal layer in a dielectric layer of the semiconductor device;
        forming an insulator layer over the dielectric layer;
        forming a bottom electrode layer over the first metal layer;
        forming a MTJ over the bottom electrode layer;
        forming a top electrode layer over the MTJ;
        patterning the top electrode layer and the MTJ with a first mask;
        patterning the bottom electrode layer with a second mask selective to the insulator layer; and
        forming a second metal layer over the top electrode layer.

2. The method according to claim 1, the patterning the top electrode layer and the MTJ comprising etching the top electrode layer and the MTJ selective to the bottom electrode layer.

3. The method according to claim 1, further comprising:
    forming an in-situ passivation layer over the semiconductor device;
    forming an interlayer dielectric over the semiconductor device; and
    planarizing the interlayer dielectric and the in-situ passivation layer selective to the top electrode layer.

4. The method according to claim 3, the patterning the bottom electrode layer comprising etching the in-situ passivation layer and the bottom electrode layer selective to the insulator layer.

5. The method according to claim 1, wherein a top surface of the first metal layer remains exposed following formation of the insulator layer.

6. A method for forming a magnetic tunnel junction (MTJ) between metal layers of a semiconductor device, the method comprising:
    forming the semiconductor device using a set of processing steps including no more than two masks, the set of processing steps comprising:
        forming a first metal layer in a dielectric layer of the semiconductor device;
        forming an insulator layer over the dielectric layer;
        forming a bottom electrode layer over the first metal layer;
        forming a MTJ over the bottom electrode layer;
        forming a top electrode layer over the MTJ;
        patterning the top electrode layer and the MTJ with a first mask;
        forming an in-situ passivation layer over the semiconductor device;
        patterning the bottom electrode layer with a second mask selective to the insulator layer; and
        forming a second metal layer over the top electrode layer.

7. The method according to claim 6, the patterning the top electrode layer and the MTJ comprising etching the top electrode layer and the MTJ selective to the bottom electrode layer.

8. The method according to claim 6, further comprising:
    forming an interlayer dielectric over the semiconductor device; and
    planarizing the interlayer dielectric and the in-situ passivation layer selective to the top electrode layer.

9. The method according to claim 6, wherein a top surface of the first metal layer remains exposed following formation of the insulator layer.

10. The method according to claim 6, the patterning the bottom electrode layer comprising etching the in-situ passivation layer and the bottom electrode layer selective to the insulator layer.

\* \* \* \* \*